(12) United States Patent
Salcone et al.

(10) Patent No.: US 11,762,024 B2
(45) Date of Patent: Sep. 19, 2023

(54) APPARATUS AND METHOD FOR MONITORING AND CONTROLLING UTILITY CARTS

(71) Applicant: POWER TRAKKER LLC, Mission Viejo, CA (US)

(72) Inventors: Michael Salcone, Newton, NJ (US); Thomas Reyes Caragan, Irvine, CA (US); Ann Marie Dryden, Mission Viejo, CA (US); Edward Dennis Dryden, Mission Viejo, CA (US)

(73) Assignee: POWERTRAKKER LLC, Mission Viejo, CA (US)

( * ) Notice: Subject to any disclaimer, the term of this patent is extended or adjusted under 35 U.S.C. 154(b) by 0 days.

(21) Appl. No.: 17/522,898

(22) Filed: Nov. 9, 2021

(65) Prior Publication Data
US 2022/0146582 A1 May 12, 2022

Related U.S. Application Data

(60) Provisional application No. 63/111,461, filed on Nov. 9, 2020.

(51) Int. Cl.
*G01R 31/382* (2019.01)
*G01R 31/388* (2019.01)
*G01R 31/36* (2020.01)

(52) U.S. Cl.
CPC ....... *G01R 31/382* (2019.01); *G01R 31/3648* (2013.01); *G01R 31/388* (2019.01)

(58) Field of Classification Search
None
See application file for complete search history.

(56) References Cited

U.S. PATENT DOCUMENTS

| | | | | |
|---|---|---|---|---|
| 5,095,430 A | * | 3/1992 | Bonito | A63B 55/61 473/150 |
| 5,685,786 A | * | 11/1997 | Dudley | A63B 55/61 473/409 |
| 5,923,148 A | * | 7/1999 | Sideris | H02J 7/0048 324/429 |
| 6,236,940 B1 | * | 5/2001 | Rudow | G01S 19/071 701/300 |
| 7,239,965 B2 | | 7/2007 | Wehrlen | |
| 9,475,457 B1 | | 10/2016 | Baynard | |
| 9,616,747 B1 | | 4/2017 | Breed | |
| 10,358,043 B2 | | 7/2019 | Dao | |

(Continued)

*Primary Examiner* — Ricky Go
(74) *Attorney, Agent, or Firm* — KOS IP Law LLP

(57) ABSTRACT

A system and structure determines when or if a utility cart is entering a restricted geographical area, and can disrupt the ignition of the cart to prevent or at least stop such use. The system can also determine a safe time and location for such ignition disruption. A monitoring device can remotely and reliably monitor the state of charge of the cart's battery, even for carts of a range of different battery energy capacities, rated voltage, and technical makeup, and communicate such information to a computer system. A standalone device can be retrofitted onto an existing golf cart without requiring fundamental changes to the cart's initial construction. The device can include an inexpensive module that can reliably monitor the battery state and implement ignition cutoff without requiring software processing capacity within the module.

19 Claims, 13 Drawing Sheets

(56) References Cited

U.S. PATENT DOCUMENTS

| | | | |
|---|---|---|---|
| 2006/0052918 A1* | 3/2006 | McLeod | B60L 53/305 |
| | | | 701/2 |
| 2007/0233339 A1* | 10/2007 | Wehrlen | G05D 1/0274 |
| | | | 701/25 |
| 2012/0029852 A1* | 2/2012 | Goff | G01R 31/371 |
| | | | 702/63 |
| 2016/0071339 A1* | 3/2016 | Yuasa | G01R 31/382 |
| | | | 340/636.16 |
| 2017/0151890 A1* | 6/2017 | Jager | B60L 15/20 |

* cited by examiner

| Batt Ahr | S3 | S2 | S1 |
|---|---|---|---|
| 100 | O | O | O |
| 120 | O | O | C |
| 140 | O | C | O |
| 160 | O | C | C |
| 180 | C | O | O |
| 200 | C | O | C |
| 220 | C | C | O |
| 240 | C | C | C |

| Batt V | S4 |
|---|---|
| 36 | C |
| 48 | O |

O = Open
C = Closed

FIG. 7

APPARATUS AND METHOD FOR MONITORING AND CONTROLLING UTILITY CARTS

CROSS-REFERENCE TO RELATED APPLICATIONS

This application claims the benefit of U.S. Provisional Application No. 63/111,461, which was filed Nov. 9, 2020, the entirety of which is hereby incorporated by reference.

BACKGROUND

The present disclosure relates to the field of remote monitoring and control of low-voltage or low-speed utility carts.

Utility carts, such as golf carts, typically are low-voltage and/or low-speed vehicles employed for several uses. Golf carts are the most notable of utility carts, but variations of such carts are used for many purposes, ranging from transportation at large-scale industrial sites, airports, campuses, sports arenas, concert venues and housing complexes to utility carts used by farmers, maintenance workers, tradesmen, or the like. Often, utility carts that are dedicated to purposes unrelated to golf are still referred to as golf carts.

Fleets of utility carts can be maintained and managed for lease or rental use—not only in connection with golf courses, but also in other contexts. Some leases or rental can be for short periods of time such as for a few hours or a day, and some can be for a relatively long term ranging from days to weeks to months or more.

To protect their investment, cart owners wish for the utility cart to be operated within the terms of the agreement, such as being used only within a limited geographic area and avoiding particular areas and/or situations. However, enforcement of such terms and monitoring cart usage can be difficult and expensive. The cart owner also has an interest in having reliable information about certain cart conditions, such as the state of battery charge. However, there are a wide variety of cart styles and configurations, including various battery and motor configurations. It can be difficult and expensive, especially when managing a large fleet of carts, to reliably monitor carts having such variety.

SUMMARY

The present disclosure discusses aspects that improve remote monitoring of utility carts. For example, some embodiments disclose systems and structure that determine when or if a cart is entering a restricted geographical area, and can disrupt the ignition of the cart to prevent or at least stop such use. The system can also determine a safe time and location for such ignition disruption. The present disclosure also discusses features for remotely and reliably monitoring certain cart conditions, such as the state of charge of the cart's battery, even for carts of various battery energy capacities, rated voltage, and technical makeup (such as Lithium-ion based or nickel-metal hydride-based). The present disclosure further discusses a standalone device that can be retrofitted onto an existing golf cart without requiring fundamental changes to the cart's initial construction. The present disclosure still further discloses an inexpensive module that can reliably monitor the battery state of multiple battery types and configurations without requiring software processing capacity within the module.

In accordance with one embodiment, the present specification describes a monitoring system for a vehicle having a battery configured to supply energy to a motor. The monitoring system comprises a wireless transceiver, and a monitoring module operably attached to the wireless transceiver and interposed between the battery and the motor. The monitoring module comprises an energy counting structure configured to track electrical energy flowing into or out of the battery and a battery capacity determining portion configured to determine a maximum energy capacity of the battery, the energy counting structure keeping track of total energy in the battery relative to the maximum energy capacity and configured to output a state of charge signal. The state of charge signal is communicated to the wireless transceiver for communication to a remote computer system.

In some embodiments, the monitoring module is characterized by lack of software. In some such embodiments the monitoring module can be in communication via the wireless transceiver with a remote computer having a processor, and the processor is configured to perform calculations on the state of charge signal to calculate a percentage of charge of the battery. The processor can be configured to output the percentage of charge to a computer screen.

In a further embodiment, the battery capacity determining portion configures a plurality of manual switches, and the battery capacity determining portion is configured to identify the maximum energy capacity of the battery based on positions of the manual switches.

In some such embodiments the battery capacity determining portion is configured to identify the maximum energy capacity as on of a plurality of possible discrete capacities based on positions of the manual switches.

In a yet further embodiment, the monitoring module additionally comprises an automatic recalibration portion, the automatic recalibration portion configured to trigger recalibration of sensed battery capacity to a maximum energy capacity automatically upon sensing a battery voltage at or more than a threshold valve while also sensing that an ignition circuit of the utility cart is in an interrupted condition.

In some such embodiments, the automatic recalibration portion comprises a manual switch, the manual switch being configured to set the threshold voltage.

In still a further embodiment an ignition circuit of the vehicle passes through the monitoring module, and a relay switch is interposed in the ignition circuit within the monitoring module. The monitoring module can comprise an ignition control circuit portion configured to receive a cutoff signal from a source remote from the monitoring module and to open the relay switch when receiving the cutoff signal.

In some such embodiments, the motor is a gas-powered motor.

In a further embodiment the vehicle can be a utility cart.

In additional embodiments the motor can be an electric motor.

BRIEF DESCRIPTION OF THE DRAWINGS

FIG. 7 shows schematic diagrams of switches for use with the circuit diagram portion of FIG. 6;

DESCRIPTION

Figure 1:
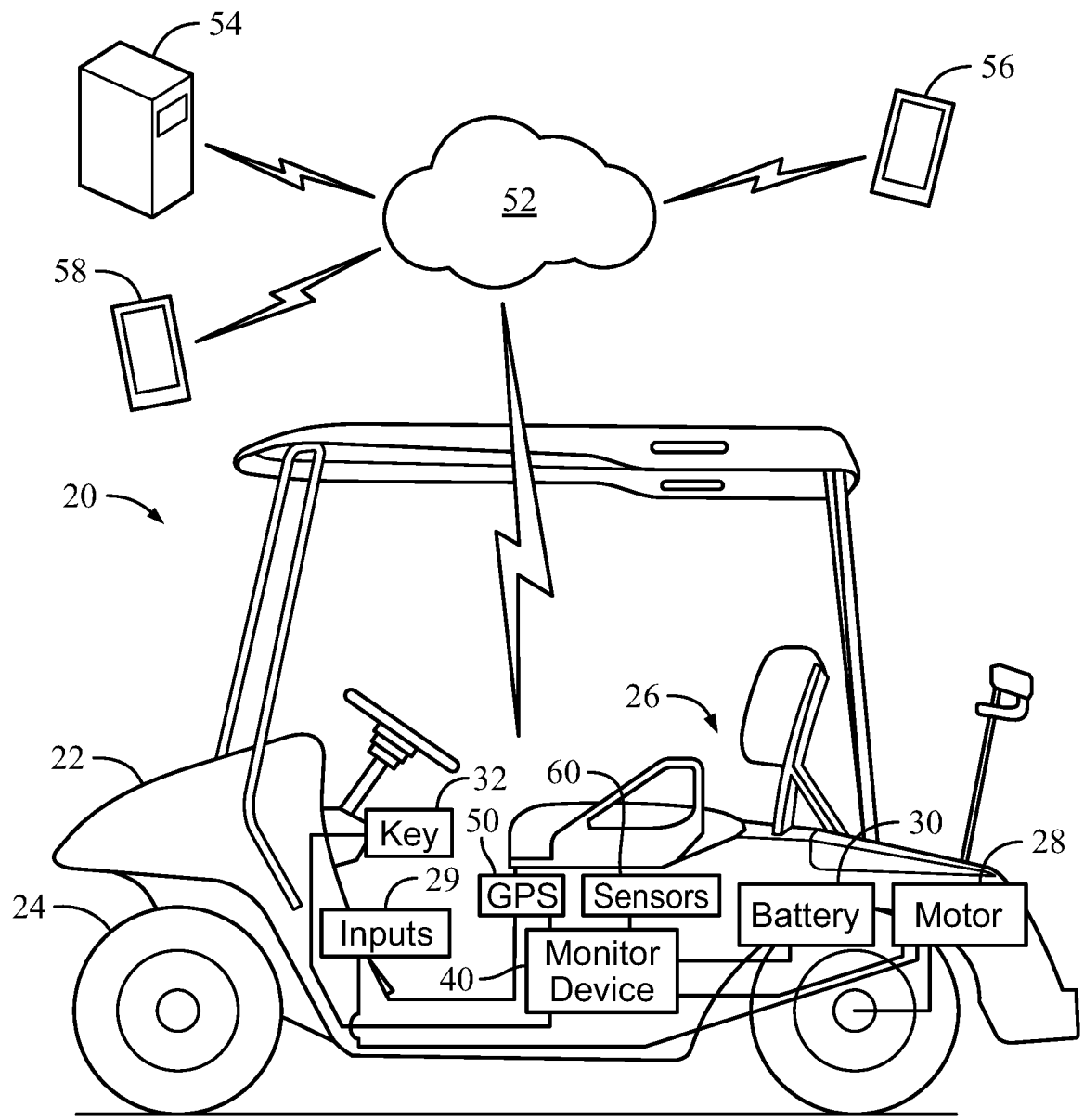
FIG. 1 shows a golf cart with schematic representations of various systems and devices and their interrelatedness.

With initial reference to FIG. 1, a utility cart 20, depicted here as a golf cart, is a vehicle having a body 22 and being configured to roll upon wheels 24. A user/driver can sit in a seating area 26. The illustrated cart 20 comprises a motor 28 configured to drive the wheels 24. The motor 28 can include a motor controller. In a preferred embodiment the motor 28 is an electric motor. Driver inputs 29, such as from an accelerator, can be communicated to the motor controller to indicate control of the motor 28.

A battery 30 can be configured to provide energy for operating the electric motor 28. The battery 30 can take various forms, both in configuration and battery type. For example, the battery 30 can comprise an array of nickel-metal-hydride batteries arranged in series, and/or the battery 30 can comprise an array of Lithium ion batteries. Typically for such carts the battery voltage ranges from about 32-60 VDC, with some relatively standard voltage ratings (such as 36V and 48V). The battery 30 can also have a range of capacities. For example, some batteries can have a capacity as low as 100 Amp*hours (Ahr), while others can have a capacity as high as 240 Ahr. It is anticipated that, as battery technology evolves, batteries with greater capacity may be employed.

In some existing carts the battery 30 is directly connected to the motor 28 via the ignition circuit. With continued reference to FIG. 1, and additional reference to FIG. 2, however, in the illustrated embodiment a monitoring device 40 is electrically interposed between the battery 30 and the motor 28. More specifically, the battery 30 is connected directly to the monitoring device 40, and the monitoring device 40 provides electrical power to the load, or motor 28, preferably via an ignition circuit. As will be discussed in more detail below, a monitoring module 42 of the monitoring device 40 receives the battery power and monitors the state of charge of the battery 30. A key switch 32 is configured to be selectively opened and closed via a key possessed by the user. The key switch 32 preferably is part of the ignition circuit so that the key switch 32 must be closed in order for power to be communicated from the battery 30 to the motor 28.

Figure 2:
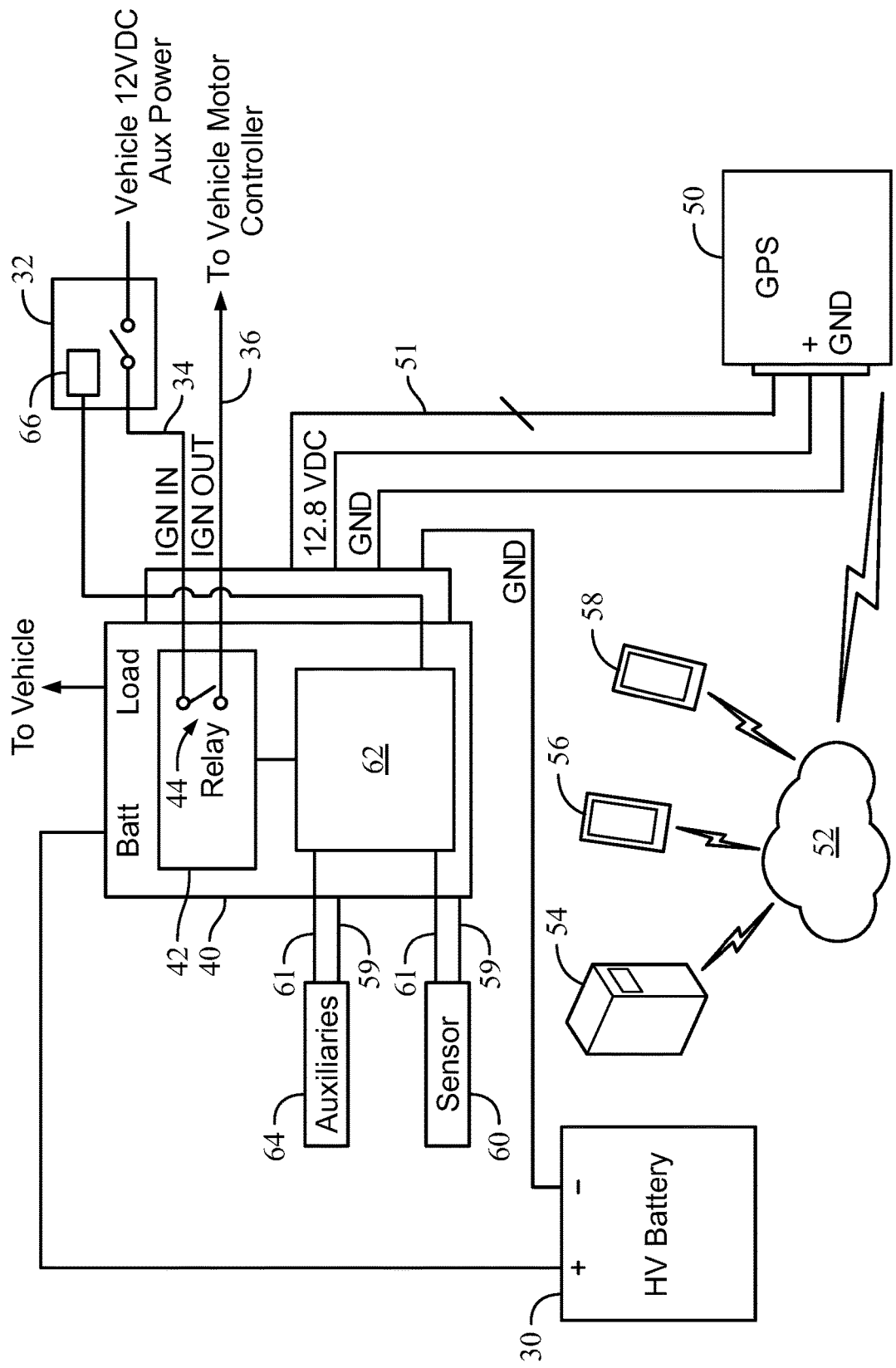
FIG. 2 is a schematic representation of an embodiment of a monitoring device having features as discussed herein, showing interconnections with systems and structure of a utility cart.

In the embodiment illustrated in FIG. 2, from the key switch 32, an ignition IN wire 34 is connected to the monitoring module 42, and an ignition OUT wire 36 extends from the monitoring module 42 to the motor 28. Preferably, the monitoring module 42 includes a relay switch 44 disposed between ignition IN 34 and ignition OUT 36 lines to selectively interrupt power delivery to the motor 28.

With continued reference to FIGS. 1 and 2, a GPS unit 50 is mounted on the cart 20. The GPS unit is electrically connected to the monitoring module 42, which provides power thereto. Preferably, a data wire 51 also extends from the GPS unit 50 to the monitoring module 42. The illustrated GPS unit 50 preferably includes a transceiver and antenna configured to transmit and receive wireless communication signals. Preferably, the GPS unit 50 also includes a processor in order to process such communications. The GPS unit 50 is configured to use the Global Positioning System—or another geolocation system—in order to determine the geographic location of the cart 20, and to transmit the location via a wireless communication network 52 to a server 54, where the location information can be further processed and/or saved in a database. The antenna and transceiver of the GPS unit 50 in the illustrated embodiment can also be used to transmit data from the monitoring unit 40 to the server 54 and/or receive instructions that can be passed along to the monitoring module 42. Notably, the power connection to the GPS unit 50 is independent of both the key switch 32 and the relay switch 44. Thus, location of the cart 20, and communication with the cart 20, can be enabled without regard to the ignition status.

With continued reference to FIGS. 1 and 2, other computing devices, such as an administrator mobile computing device 56 and a user mobile device 58 can communicate via the wireless network 52 with the server 54 and/or with the GPS unit 50. As discussed in more detail below software applications on the server 54, administrator device 56 and/or user device 58 can use data received from the monitoring device 40 to provide information about the associated cart 20 and/or send instructions, such as instructions to actuate the relay switch 44 to stop power delivery to the motor 28.

With continued reference to FIGS. 1 and 2, some embodiments can employ additional structure and features. For example, one or more sensors 60 can be placed on or around the body 22 of the cart 20 so as to collect various types of information. For example, sensors 60 can include environmental sensors such as sensors to detect temperature, humidity, wind speed and direction, as well as vehicle sensors such as sensors to detect user inputs such as steering wheel position, accelerator and/or brake pedal position, forward or reverse gear positions, tire pressure, and the like. Further sensors can include vehicle condition sensors such as monitoring the weight placed on the axle, tip-over or rollover sensors, and the like. Preferably, power for such sensors 60 is provided by power wires 59 from the monitoring device 40. In some embodiments, data wires 61 may communicate sensor data to the monitoring device 40. Data from such sensors 60 can be communicated to the GPS unit 50 for transmission to the server 54. In some embodiments the monitoring device 40 can include a data module 62 configured to receive and route such data. In additional embodiments, the data module 62 can be included with the monitoring module 40.

Continuing with reference to FIG. 2, another feature that can be included in some embodiments are accessories 64 such as gauges (for battery state of charge, cart speed, or the like), a screen for conveying information to and receiving inputs from the user and speaker. As with the sensors 60, accessories can be powered by the monitoring device 40 and communicate data to and from the GPS unit 50.

In yet another embodiment, the key switch 32 can include a user ID module 66. In such an embodiment, the key used by the user also includes indicia of the user's identification. For example, the key may include an RFID card or fob that operates to actuate the key switch 32, but also communicates data about the user ID. Such data can be communicated to the GPS unit 50 for further communication to the server 54.

In some embodiments, one or more of the sensors 60 and accessories 62 can be configured to be powered and operable independent of the ignition circuit, and thus can be operable regardless of whether the key switch 32 or relay switch 44 is actuated. In other embodiments one or more of the sensors 60 and accessories 62 can be arranged to be operable only when the ignition circuit is closed. Preferably, the GPS unit 50 is powered independent of the ignition circuit and thus is operable regardless of whether the ignition circuit is interrupted.

Figure 3:
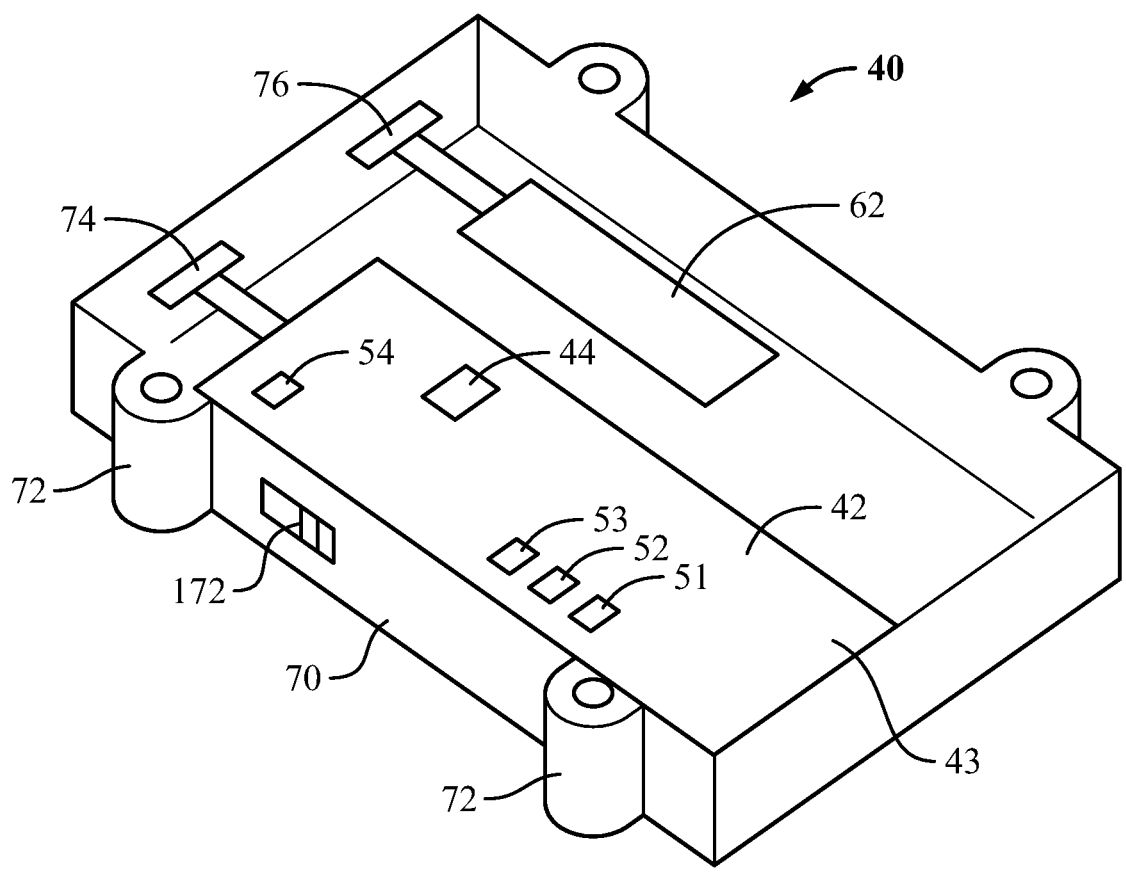
FIG. 3 is a perspective view of a portion of a monitoring device configured for retrofit installation in a utility cart.

Many existing carts 20 do not include a monitoring device 40 when initially manufactured. In such carts 20, the battery 30 often is configured to power the motor 28 so long as the key switch 32 of the ignition circuit is closed. In some embodiments, the monitoring device 40 can be added to such carts 20 after manufacturing, as an aftermarket addition to the cart. In such embodiments, and with next reference to FIG. 3, the monitoring device 40 can comprise a housing 70 having mounts 72 configured to support the housing 70 within the body 22. A power wire bus 74 can be provided to connect to components such as the ignition in and out wires 34, 36, battery input and battery load output wires, and other wires associated with power delivery. In some embodiments a data line bus 76 can be provided to connect to data lines from various components and to connect such data lines to the data module 62, from which the data can be communicated to (and from) the GPS unit 50, which includes the wireless transceiver.

With reference next to FIGS. 4-7, circuit diagrams are provided for an exemplary embodiment of the monitoring module 42, which comprises a printed circuit board 43 having a plurality of electrical hardware components. Preferably, the monitoring module 42 is configured to operate without software. As discussed in more detail below, the monitoring module 42 monitors the state of charge of the battery 30 and outputs a signal indicating the state of charge, which signal can be communicated to the GPS unit 50 and further to the server 54. The monitoring module 42 also conditions power in order to power the GPS unit 50, and can be configured to condition power for other components. Further, the monitoring module 42 selectively actuates the relay switch 44 so as to interrupt the ignition circuit and cut off power delivery to the motor 28 when desired.

In a preferred embodiment, the monitoring module 42 employs several integrated circuits, as well as typical electronic hardware such as resistors, capacitors, inductors, MOSFETs, op amps, decision gates and the like to monitor and report the battery state of charge. Preferably no computer processor, which would analyze data and make decisions based on a software program, is used. Further, preferably no software is employed in the monitoring module 40, thus leading to a reliable yet inexpensive device.

Figure 4:
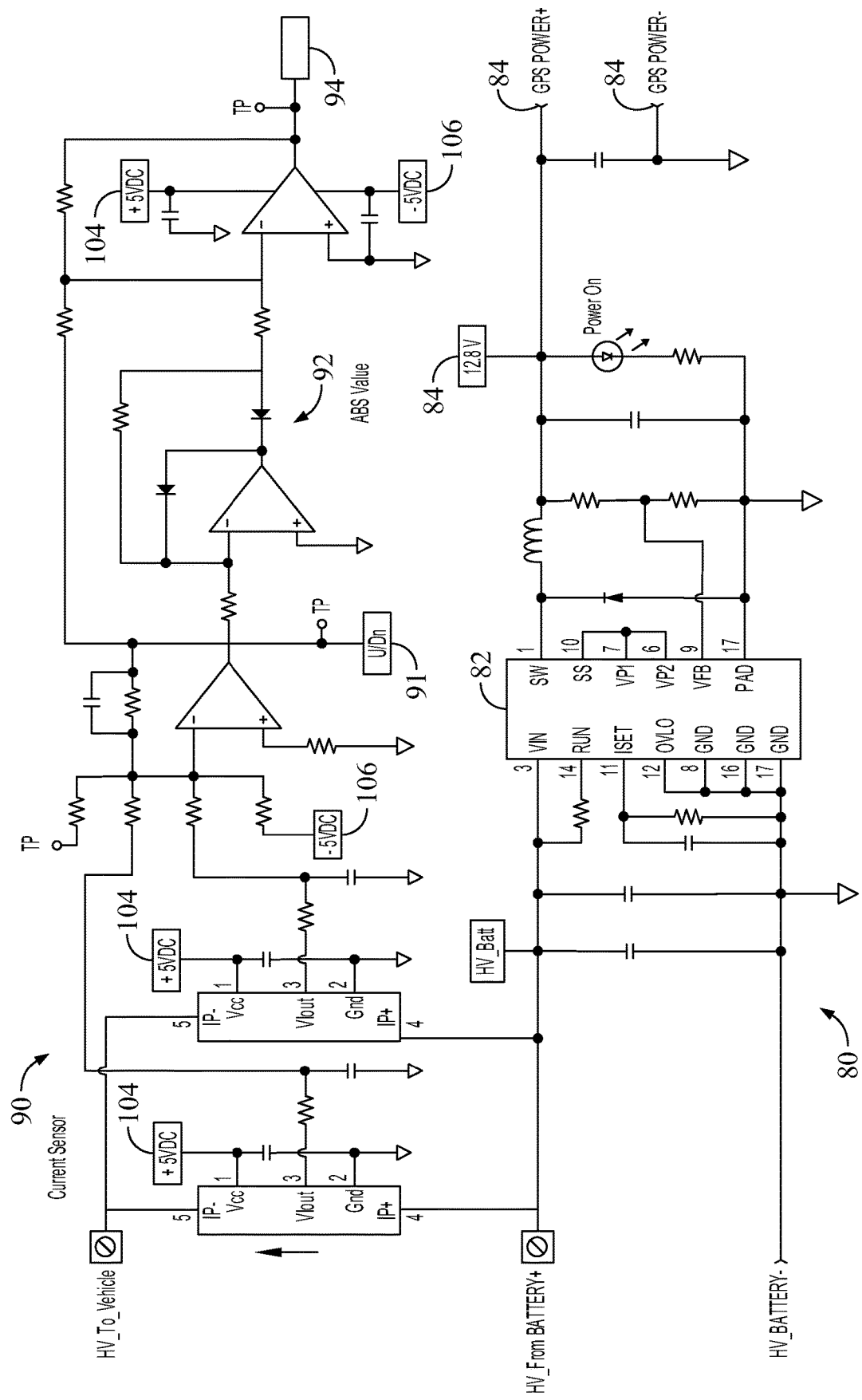
FIG. 4 is a circuit diagram of a portion of a monitoring module of the monitoring device.

With specific reference to FIG. 4, a GPS power portion 80 of the monitoring module 40 is a DC to DC converter 80 configured to reduce the battery voltage to a voltage appropriate to power the GPS unit 50. For example, in one embodiment the battery voltage is reduced to 12.8V, and this reduced voltage is delivered to the GPS unit 50. The DC to DC converter 80 can include a step-down regulator 82 such as LTC3637, which is available from Analog Devices. The GPS power portion 80 outputs a powering voltage 84, which can be communicated to power the GPS unit 50. The powering voltage 84 can also be communicated about the monitoring module to power various items of hardware, such as multiple op amps, and even a second DC/DC converter 102.

With specific reference to FIG. 7, the second DC/DC converter 102 preferably is configured to output a lower-voltage power in order to supply power to further portions and components of the monitoring module 42. While various types and configurations of converters 102 can be employed, the illustrated embodiment uses a dual output NMA1205SC DC/DC converter available from Murata Power Solutions. The second DC/DC converter 102 preferably outputs a secondary positive 104 and a secondary negative 106 power output voltage, which are connected to multiple locations through the monitoring module 42 to power hardware such as integrated circuits, logic gates and the like.

Figure 5:
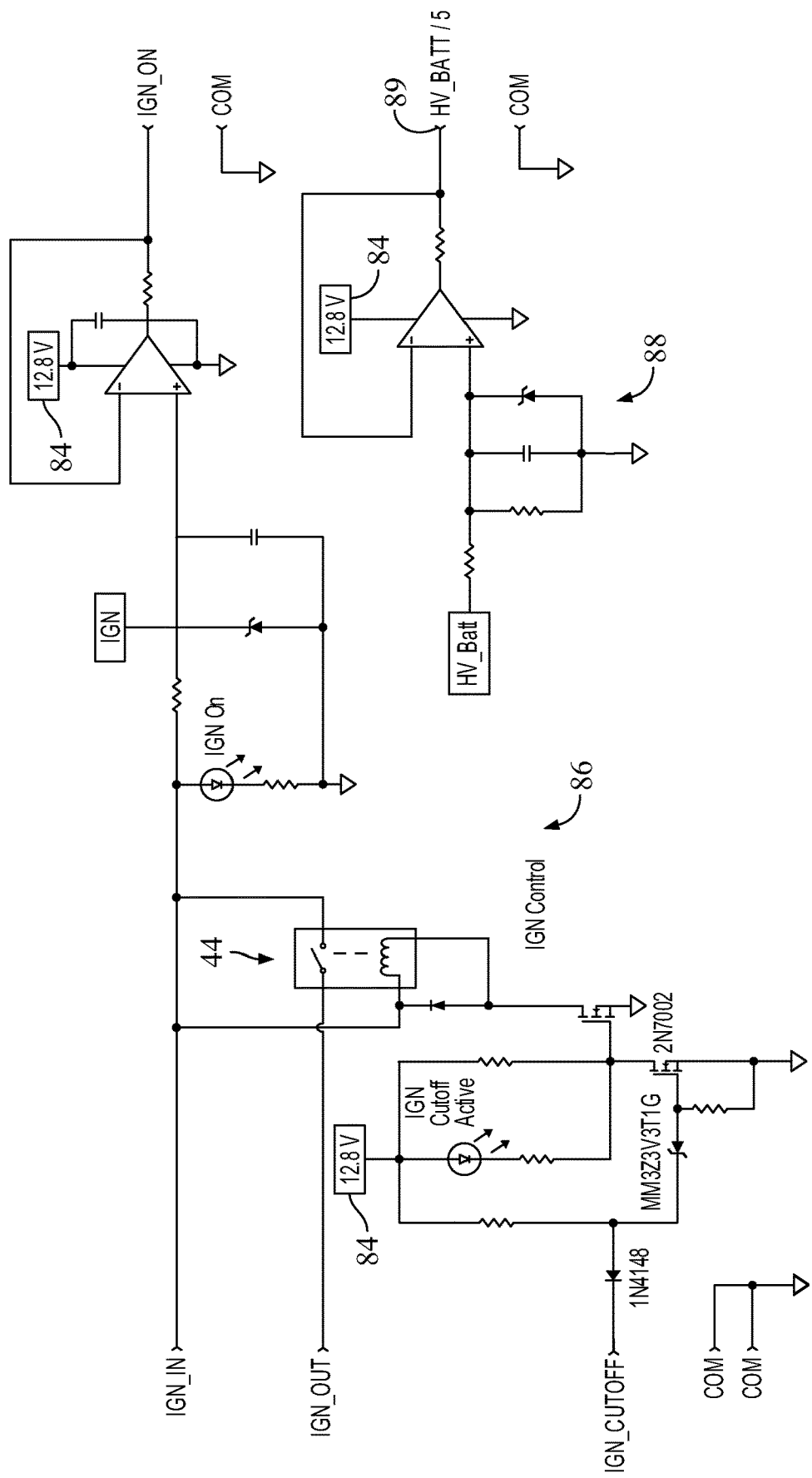
FIG. 5 is another circuit diagram of another portion of a monitoring module of the monitoring device.

With reference next to FIG. 5, an ignition control circuit portion 86 is configured to send a data signal when ignition is ON to the server 54 via the GPS unit 50. As discussed in more detail below, the server 54 or mobile device 56 are configured with the ability to send a cutoff authorization signal to the monitoring module 42 via the GPS unit 50, which cutoff authorization signal can be communicated to the ignition control circuit portion 86 Upon receiving the cutoff authorization and inductor of the ignition control circuit portion 86 is actuated to open the relay switch 44, thus interrupting the ignition circuit, and stopping power from reaching the motor 28. The motor 28, and cart 20, become inoperable. Further, a cutoff signal indicating that the ignition control circuit portion 86 has been interrupted can be communicated via the GPS unit 50 to the server 54.

With continued reference to FIG. 5, the monitoring module 40 can also include a voltage monitor portion 88, which receives the battery input voltage and reduces it. In the illustrated embodiment the voltage is reduced to ⅕ the actual voltage. This reduced voltage signal 89 is then communicated to the server 54. The server 54, then, can calculate the actual voltage by multiplying the reported voltage by 5.

With reference again to FIG. 4, the monitoring module 40 tracks and measures battery state of charge, preferably by a method known as "joule counting", or "coulomb counting", in which the current flowing out of the battery during use of the cart 20, as well as current flowing into the battery 30 during charging, is tracked. A current sensor portion 90 detects such current flow and creates an analog signal indicative of such current flow. The illustrated current sensor portion 90 employs a pair of current sensors, which can include ACS772ECB current sensors, available from Allegro MicroSystems, and available in various capacities, such as 400 A max or 600 A max. The current sensor portion 90 can detect whether current is being drained from the battery 30, such as during use of the cart 20, or added to the battery 30, such as during plug-in charging or regenerative braking. An up/down output signal 91 is generated by the current sensor portion 90 depending on whether battery charge is going up or down.

The current sensor portion 90 outputs an analog current sensor value to an absolute value portion 92, which receives the analog signal and converts it to a positive, digital, absolute value voltage within a selected range. The range can be selected as desired. In one embodiment the range is between 0-1V, with the voltage within this range being a ratio of the maximum current flow. For example, if the absolute value voltage is 1, then the current is being driven at 100%; if the voltage is 0.5, the current is being driven at 50%, and if the voltage is 0, no current is flowing. The absolute value voltage is an output signal 94 of the absolute value portion 92.

Figure 6A:
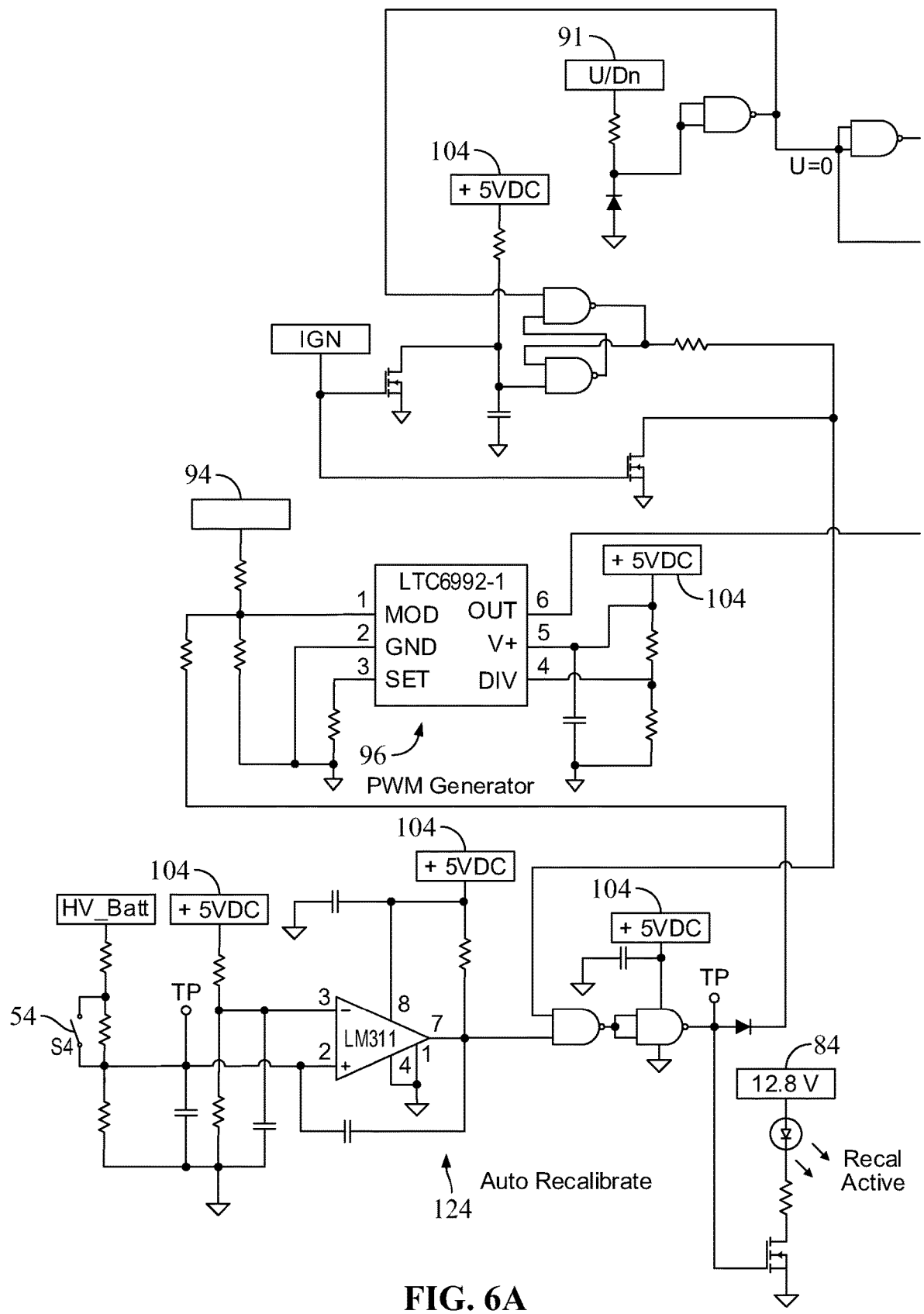
FIG. 6 is yet a circuit diagram of yet another portion of the monitoring module of the monitoring device.
Figure 6B:
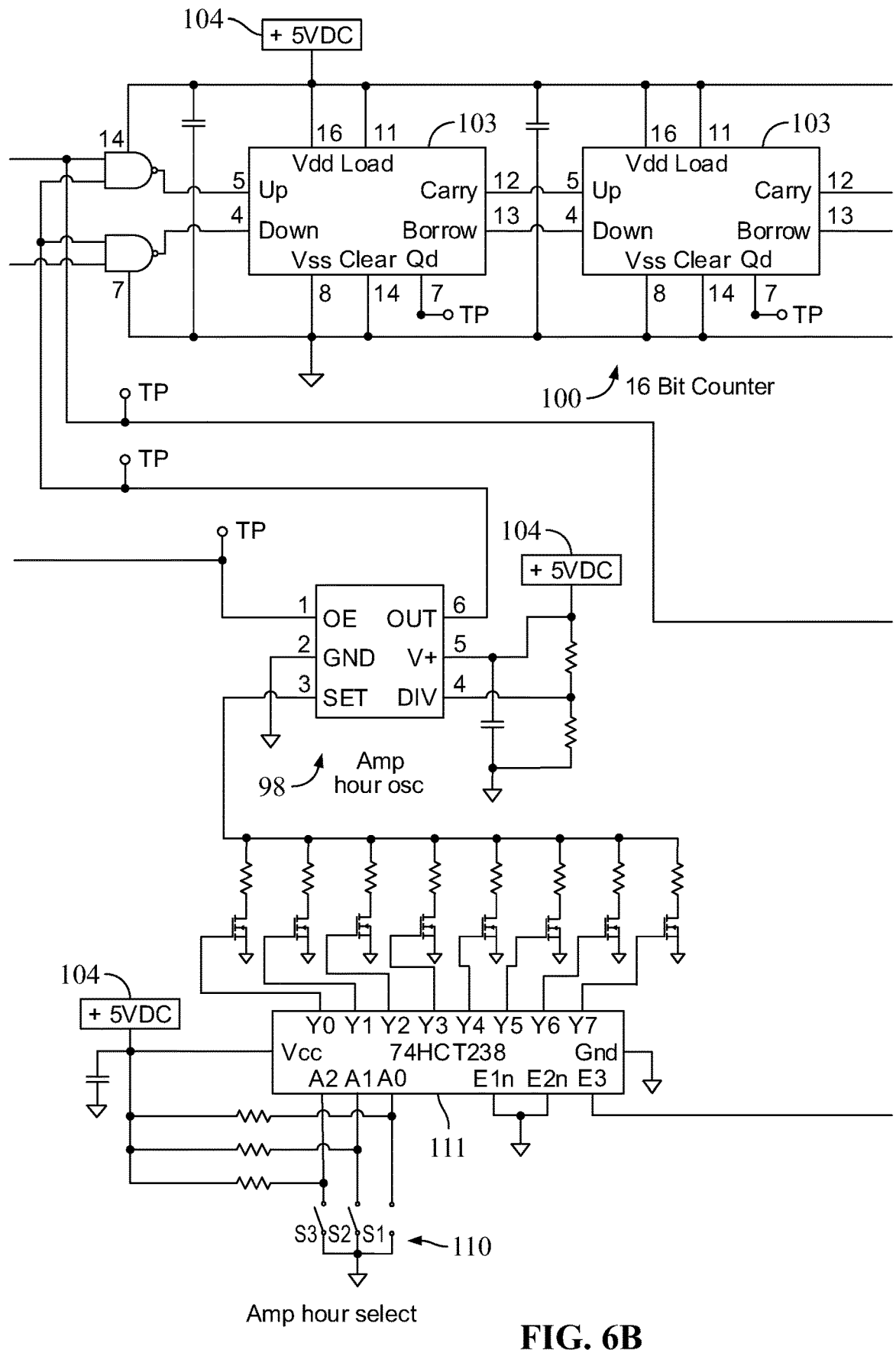
Figure 6C:
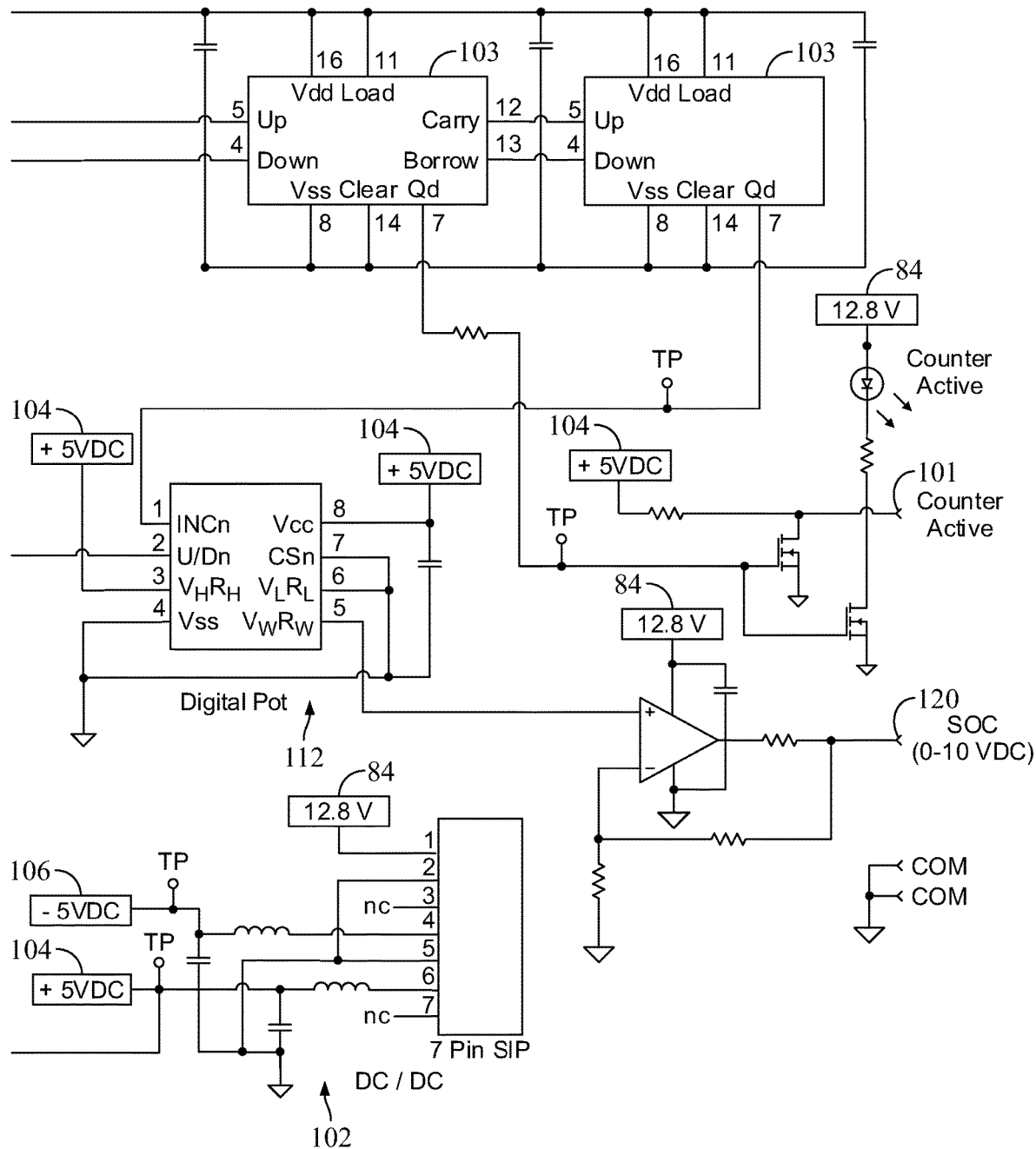

With additional reference to FIG. 6, in the present embodiment the absolute value voltage signal 94 is communicated to a pulse width modulation portion 96, which receives the absolute value voltage signal 94 and converts it into a pulse width modulation, or duty cycle, of between 0-100% based on the ratio indicated by the absolute value voltage signal 94. It is contemplated that any of a plurality of specific circuit constructions can be employed. However, the present embodiment can use pulse width modulator LTC6992, available from Analog Devices. Such modulation is passed on to an Amp hour oscillator 98, which converts the pulse width modulation, or duty cycle, into pulsed oscillations corresponding to the current flow. For example, greater current flow will prompt greater oscillation speed, and vice versa. While a plurality of different oscillator designs and equipment are contemplated, the present embodiment can use a voltage controlled oscillator such as LTC6990, available from Analog Devices.

The pulsed oscillations corresponding to the current flow are output to a bit counter portion 100, which counts the number of oscillations, with each oscillation corresponding to a portion of current. Thus, the energy, in joules, passing through the battery 30 is able to be counted as energy flows from, or to, the battery 30. It is to be understood that various specific counter configurations can be employed. In the illustrated embodiment, however, the bit counter portion 100 is a 16 bit counter comprising four 4-bit counters 103 interconnected with one another. The illustrated embodiment employs CD40193 4-bit binary counters, which are available from National Semiconductor. The up/down signal 91 from the current sensor portion 90 signals whether the bit counter portion 100 counts upwardly, such as during charging or regenerative braking, or downwardly, such as during use of the cart 20. When the bit counter portion 100 is operating, a counter active signal 101 can be generated, and can be communicated via the GPS unit 50 to the server 54.

Information concerning the battery capacity is needed for a joule counting approach to be effective, as it provides a basis for knowing the charge remaining. The joule counting portion counts the energy depleted from the battery during use. In order for this information to have meaning, such energy depleted is subtracted from the battery's capacity. However, as discussed above, batteries 30 for carts 20 come in various sizes, configurations, and capacities.

With specific reference to FIG. 7, in the illustrated embodiment a capacity selector 110 is configured to enable an installer to set the monitoring module 42 to one of a plurality of discrete battery capacities corresponding to the capacity of the battery 30 for the particular cart 20. In the illustrated embodiment, three switches S1, S2, S3 are configured to provide an input to a decoder/demultiplexer 111. The configuration of the switches S1, S2, S3 sets the battery capacity for the monitoring module 42. More specifically, and with additional reference to FIG. 8, each configuration of switches S1, S2, S3 being closed or open corresponds to a different preprogrammed battery capacity—here divided in eight 20 Ahr increments ranging from 100 Ahr to 240 Ahr.

In the illustrated embodiment, the three switches S1, S2, S3 are connected to inputs to a 3 to 8 line decoder/demultiplexer 111, such as 74HCT238, which is available from Nexperia. The combination of switches determines which of the eight outputs is used, with each output defining a different one of the capacity settings. The selected battery capacity settings provides a context against which the joule counting system will count energy discharged from or charged to the battery. It is to be understood that, in additional embodiments, a greater or lesser number of switches can be employed so as to vary the available number of charge capacity settings as desired.

Continuing with reference to FIG. 7, the illustrated embodiment includes a digital pot 112, which receives output from the bit counter 100, increments the charge up or down as appropriate, and outputs a state of charge signal 120, which in the illustrated embodiment is a voltage between 0-10V, with 0V corresponding to 0% charge, 10V corresponding to 100% charge, and the range between 0-10V proportionally corresponding to 0-100% charge. This state of charge signal 120 can be communicated via the GPS unit 50 to the server 54, which can save the value in the database and can perform calculations on the 0-10V signal to convert it into a 0-100% charge indicator.

Although joule counting is a fairly accurate manner of keep track of the battery's state of charge, over time minor inconsistencies can add up to reduce accuracy. As such, it is preferred to recalibrate the system from time to time. A recalibration portion 124 of the monitoring module 42 is configured to automatically recalibrate the counting system from time to time upon the occurrence of specific events. The recalibration portion 124 in the illustrated embodiment is configured to recalibrate the system whenever the battery 30 is fully charged in a battery charging event. The recalibration portion is connected to the battery 30, and thus detects the battery voltage. If the battery voltage is less than its rated voltage, or a threshold voltage, the recalibration portion 124 does not operate. However, if the battery voltage meets or exceeds a threshold voltage, which preferably is the battery's rated voltage, this can be an indication that the battery 30 has been fully recharged. A fully recharged battery 30 would be at capacity, so the joule count within the battery would be taken to correspond to the capacity selected by the switches S1, S2, S3.

As discussed above, batteries 30 for carts 20 can come in different voltage capacity. Popular capacities are 36V & 48V. In the illustrated embodiment, the recalibration portion 124 comprises a voltage setting mechanism 126 comprising a switch S4. With continued reference to FIG. 6, and additional reference to FIG. 7, the switch S4 is configured to allow an installer or user to manually set the voltage setting mechanism 126 to a max voltage of 36V or 48V. As such, when the switch S4 is in the 36V position, the recalibration portion 124 will recognize that the battery voltage is full when 36V—or a threshold voltage corresponding to this setting—is sensed. When the switch S4 is in the 48V position, the recalibration portion 124 will not recognize that the battery voltage is full until 48V—or a threshold voltage corresponding to this setting—is sensed.

It is acknowledged, however, that during use, and events such as regeneration braking, the sensed voltage may temporarily exceed the threshold voltage. Thus, the recalibration portion 124 communicates with the ignition circuit (IGN) via logic gates in a manner that determines whether the ignition circuit is open or closed, and only allows the recalibration portion 124 to operate when it is sensed that the ignition circuit is open. Since the cart 20 cannot be operated with the ignition circuit is open, it is anticipated that the only time the sensed voltage will exceed the threshold voltage and simultaneously the ignition circuit will be open will be during a plug-in charging event which will fully charge the battery 30. As such, although recalibration will occur automatically, without outside prompting, it will only occur when the cart 20 battery 30 has been fully charged via a plug-in charging event. In this manner, when the battery is full, the counter associated with the battery will be reset to the battery's full energy capacity, and the state of charge will read 10V, or 100%. In the illustrated embodiment switch S4 is a toggle switch between two discrete battery voltage ratings. It is to be understood that, in additional embodiments, switches and corresponding circuitry can be configured to accommodate more choices. Also, in a further embodiment the switch S4 can be configured as to correspond to an infinite range of voltage ratings, such as by corresponding to a variable adjustable resistor.

With reference again to FIG. 3, during installation of a monitoring device 40 onto a cart 20, the installer shall make note of the battery 30 capacity and rated voltage. The installer then accesses switches S1, S2, S3 and sets them to the pattern corresponding to the indicated battery capacity. The installer also accesses switch S4 and sets it to the indicated battery voltage rating. As such, a single style of monitoring device 40 can accommodate a broad range of battery voltage rating and capacity configurations without fundamental modification.

Notably, the above-described embodiment of the monitoring module 42 is configured to operate using only hardware, with no software. No central processing unit guides the operation of the various portions of the monitoring module 42. Rather, the hardware components react automatically to the various inputs. Further, output signals, such as the state of charge signal 120 and the like, are not interpreted by the monitoring module 42. Rather, such signals are transmitted via the GPS unit 50 to a processor-based computer, such as the server 54, where interpretive calculations are made, such as transforming the 0-10V state of charge signal 120 into a more user-friendly 0-100% state of charge indication. As such, a durable and inexpensive module 42 is provided. Yet the module 42 still is versatile enough to use with a plurality of different carts 20 having differing configurations and capacity of batteries.

As discussed above, the monitoring device 40 outputs various signals and data that are communicated wirelessly to the server 54. The server 54 saves such data in a database, and makes such data available for use by software-based applications that perform calculations and evaluations of the data for presentation to a user. Depending on embodiments, users can be administrators managing a fleet of carts, a renter of a specific cart, or a cart owner managing a fleet of their own single cart.

Figure 8:
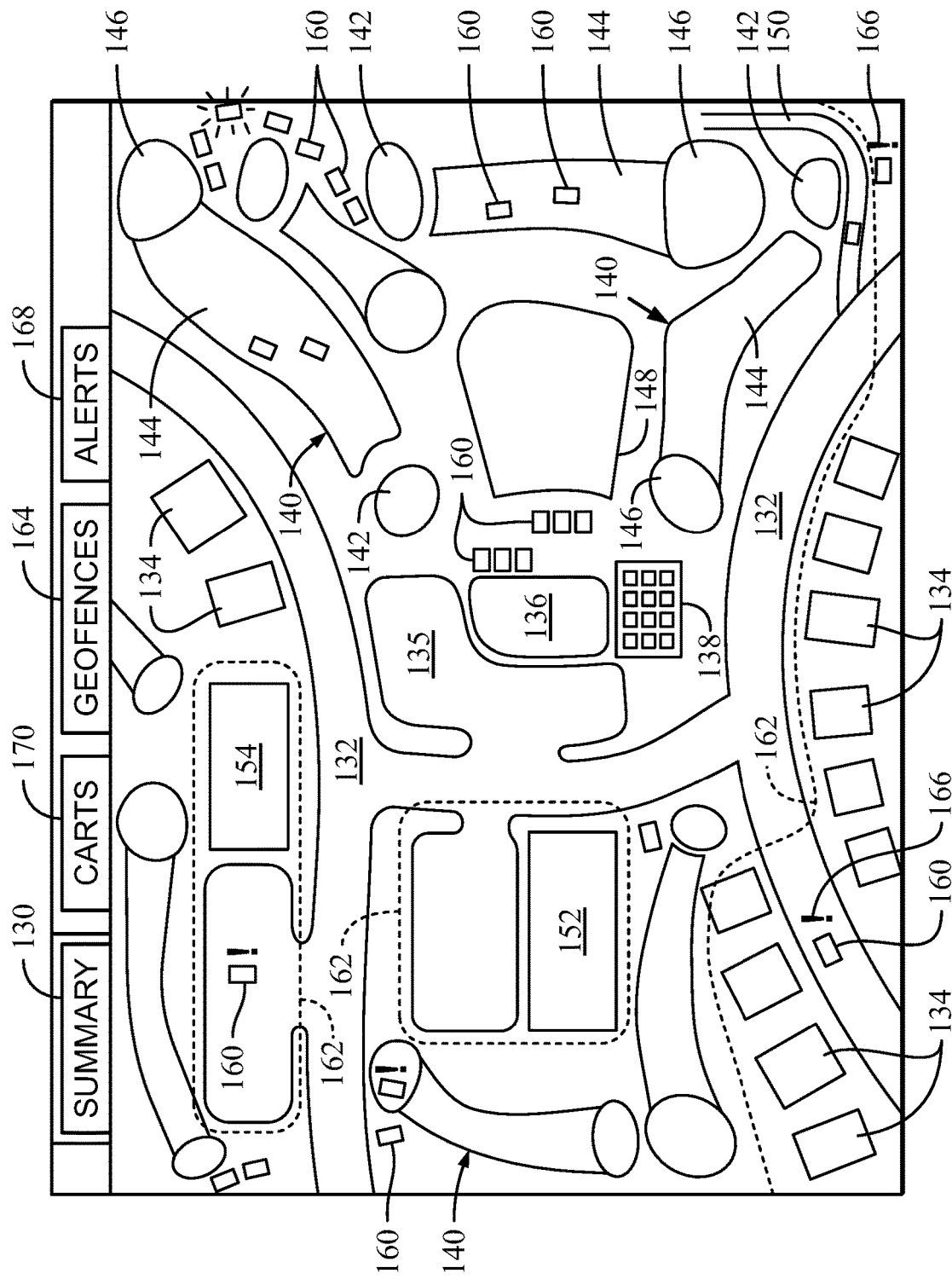
FIG. 8 is a screen shot of an application configured to be used with the monitoring device.

With reference next to FIG. 8, a screen shot is provided of an administrative application for managing a fleet of carts 20. The illustrated embodiment depicts managing a fleet of carts for a golf course. The application can have any number of tabs and configurations. In the illustrated screen shot, a summary tab 130 presents a map of at least a portion of a management area (i.e., golf course). The map can depict various features, such as roads 132, private residences 134, the golf course parking lot 135 and clubhouse 136, a cart rental area 138, as well as golf course holes 140, which generally comprise at least a tee box 142, fairway, 144 and green 146. The golf holes 140 can be interwoven with other features presented on the map. For example, a driving range 148 is also presented, as well as a cart track 150, which cart tracks 150 may be provided in selected areas of the golf course. Other, possibly related institutions, such as a pool or tennis club 152 and a hotel 154, with their associated parking lots, can be presented.

Icons 160 on the map can depict particular carts 20, and can be associated with a cart name or number. Such icons 160 are placed on the map based on calculations made by the server 54 on GPS data received from the corresponding cart 20. Each icon 160 can be clicked on to pull up information about that particular cart 20.

Geofences 162 are depicted on the map, and are hypothetical lines that can be established by the administrator, such as by accessing the geofences tab 164. In the illustrated screenshot, geofences 162 are depicted. Other geofences can also be included. For example, there may be geofences about every golf hole 140, tee box 142 and green 144. The geofences preferably are maintained in the memory of the server 154, remote from the carts 20. The server 54 preferably is configured to monitor GPS data received from the carts 20 and compare such position data to geofences saved theron.

When a cart 20 crosses a geofence, the server 54 can access data concerning the particular cart to determine whether the cart 20 is authorized to cross a particular geofence 162. For example, some cart renters may be permitted to go to the pool 152 and/or hotel 154, while others may not. If a cart 20 has violated a geofence rule, the system may display an alert 166 indicating a violation. Some geofences 162 may apply to all carts 20. For example, a cart that enters a green can generate an alert 166. Geofences 162 can be set to identify carts that may be leaving the area, due to driver confusion or due to theft, and generate an alert 166.

Preferably, an administrator can click on a particular alert icon 166 and/or the associated cart icon 160 to bring up information about a particular alert and what has triggered the alert. An administrator can also access an alerts tab 168 to bring up a list of pending alerts, an alert history, and other information. Accessing a carts tab 170 can lead the administrator to a listing of carts 20, from which the administrator can select any cart to learn more information about that particular cart.

Figure 9:
FIG. 9 is screen shot of a mobile application configured to be used with the monitoring device.

With reference next to FIG. 9, a screen shot from a mobile version of an administrator application depicts information concerning a particular cart 20, which can be accessed by, for example, clicking on the carts tab 170, an icon 160 or the like. A plethora of information can be presented concerning the associated cart, and information can also be input. For example, the cart can be given a name, and also an identification of the cart, which is generally more complex than a simple name, is presented, as well as other information, such as the network data concerning how communication is managed with the cart. The type of icon 160 can be set, as well as information about the battery voltage rating and type of cart 20 (such as whether it is a golf-specific cart or maintenance-specific cart). A protocol can define permissions and/or terms of use that apply to the cart's rental agreement. Further, the contact phone number of the cart user/renter can be displayed for easy access by the administrator.

The screenshot of FIG. 9 also shows further options presented to the administrator. For example, an ignition kill button 170 allows the administrator the option to direct the server 54 to send a signal to the monitoring device 40 to actuate the relay switch 44 in order to cut the ignition circuit and thus disable the cart 20. Such a signal would be sent from the server 54 to the GPS unit 50, from which it can be passed along to the ignition control circuit portion 86, which would open the relay switch upon receipt of the signal. In additional embodiments, other options can be made available to the administrator. For example, rather than immediately kill the ignition, the administrator may have the option to signal an accessory 64 comprising a noisemaker to generate an alarm, such as a buzz, to make the cart user aware of the violation. If steps are not taken to correct the alert, the administrator may then call the user and/or signal ignition cutoff. In some embodiments the system can be configured to automatically generate the cutoff signal if a particular one of more of the geofences are crossed by the cart 20. However, in some such embodiments the system can be configured to first use GPS data to determine whether the cart's location is safe for disabling. As such, the cart will not be disabled, for example, in the middle of a high-speed road.

Figure 10:
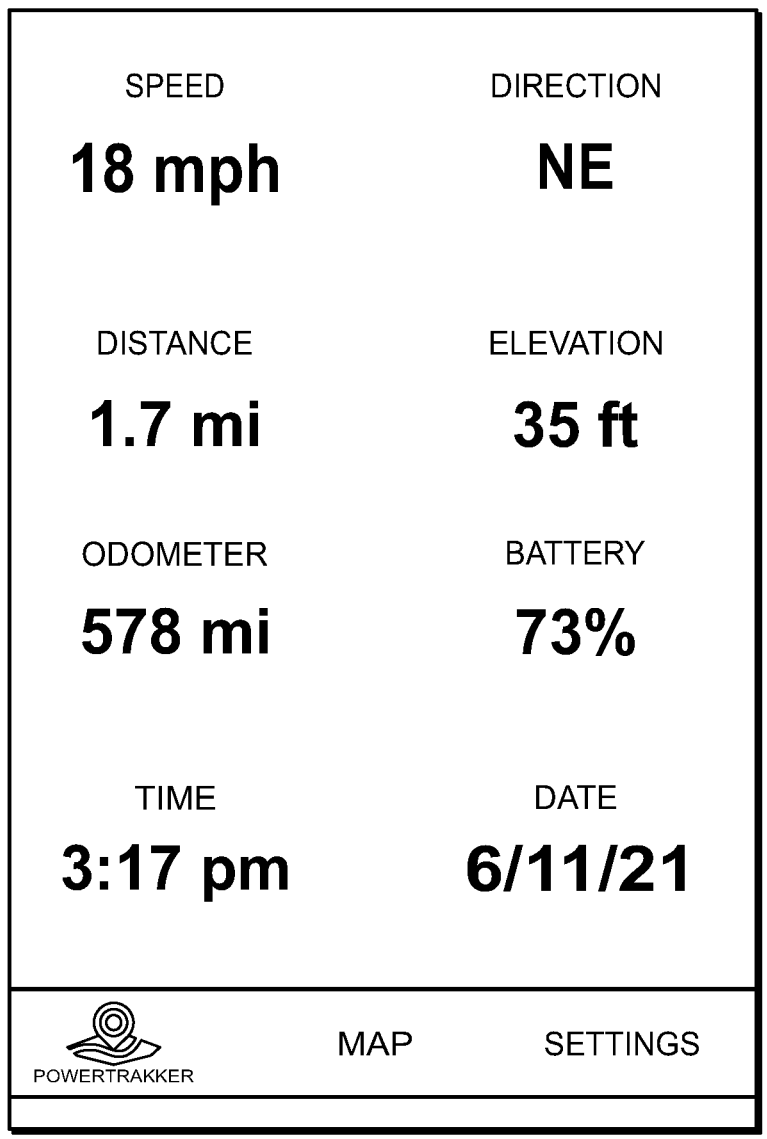
FIG. 10 is another screen shot of a mobile application configured to be used with the monitoring device.

FIG. 10 presents another screen shot from a mobile version of an administrator application, depicting further information about a particular cart. Much of the information on this page can be calculated by the server 54 based on GPS data. Other data, such as battery state of charge, is calculated by the server 54 based on state of charge signals received from the monitoring device 40, and presents a real-time indication of the remaining battery capacity. Such information can be especially helpful in determining whether a particular cart is in condition to be rented or needs to be recharged first.

A user application, intended for use by a user or renter of a cart 20, may also include a screenshot similar to that of FIG. 10, which presents information particularly relevant to the user. The user application can also present information important to the application, such as, for example, current flag positioning and distance data corresponding to the golf hole 140 at which the user and cart are located.

Figure 11:
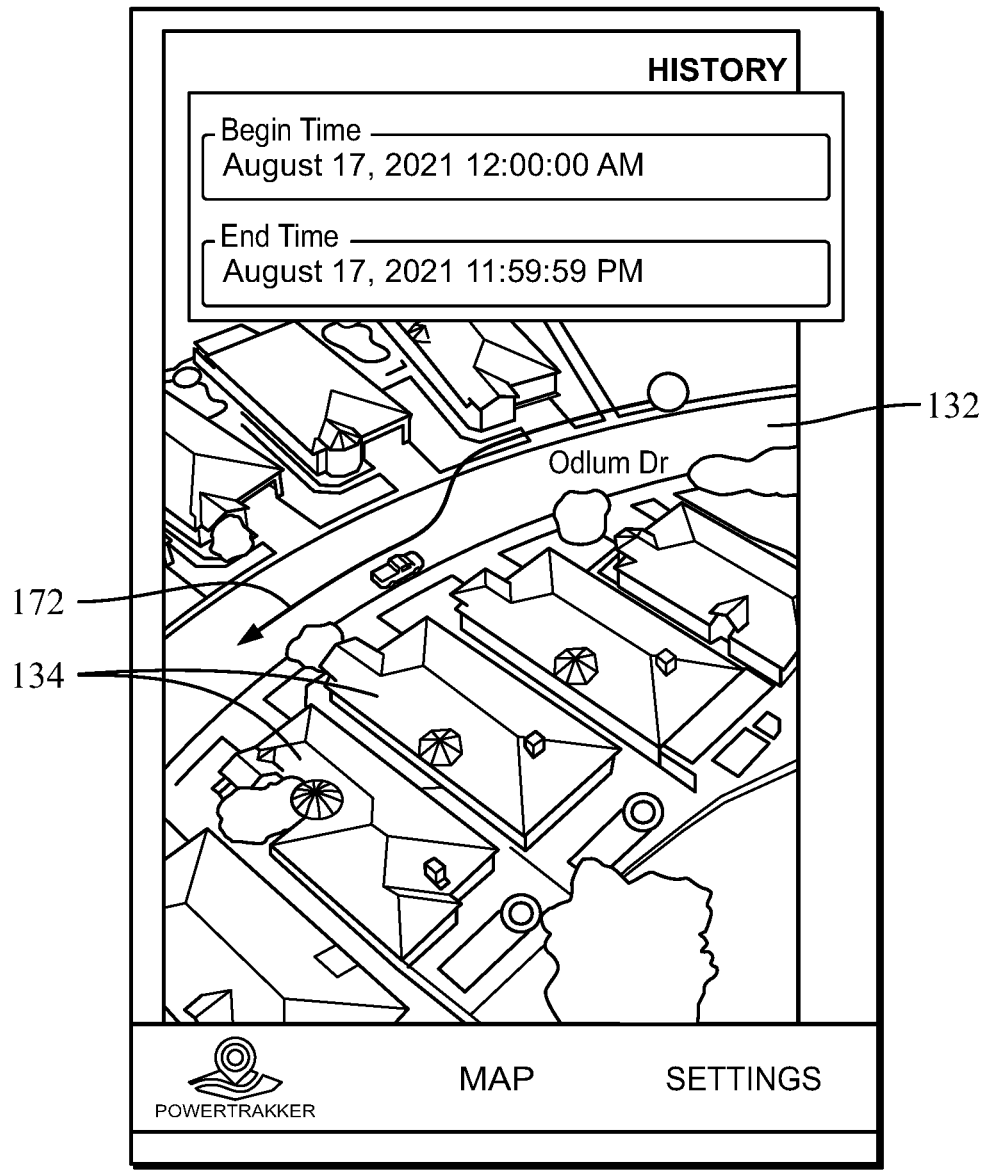
FIG. 11 is yet another screen shot of a mobile application configured to be used with the monitoring device.

Preferably, the server 54 maintains a database of data received about each cart. Thus, the administrator application can present historical data. For example, with reference next to FIG. 11, a screenshot is depicted in which the historical path 172 of a particular cart is depicted and presented on the map. The path 172 preferably is calculated based on historical position data maintained in the server 54.

Historical data within the server can be used for other advantageous uses. For example, for each cart the server 54 can keep track of how distance travelled compares with battery state of charge over time. If a pattern is identified in which a trend showing the distance travelled per battery capacity is decreasing, and for example if it has decreased below a predetermined threshold, an alert may be generated indicating that the battery 30 of the particular cart 20 is due for maintenance and/or replacement.

The server 54 can also use data to make helpful calculations. For example, by analyzing the position and directional heading of a particular cart 20 against the state of charge of the cart, the server 54 may predict whether the cart 20 is at risk of not having enough battery energy to return to the rental shop 138. An alert can then be generated either for the user or administrator or both in order to deal with the issue.

With reference again to FIG. 8, further calculations and monitoring of data by the server 54 can also help with golf course management. For example, the server can compare cart locations, and if it is determined that an excess of carts are located particularly close together in connection with a particular golf hole 140 or holes, an alert 166 can be generated to alert the administrator to the problem.

It is to be understood that the system may use additional data for beneficial uses. For example, in an embodiment in which sensors 60 are disposed on the cart 20, the server 54 can identify needs and concerns before or as they arise. In one embodiment a cart may have a rollover sensor. When the rollover sensor is triggered, such as if a cart accidentally rolls off a cart path 150 and into a ravine, an alert 166 can make the administrator immediately aware of the problem.

The embodiments specifically discussed above have been made in the context of a cart 20 employing an electric motor 28 powered by batteries 30. It is to be understood, however, that some of the features discussed herein can be relevant to carts having gas-powered motors. For example, an administrator can still have the option to signal the relay switch 46 to cut the ignition of the cart 20 so as to disable the cart when it is desired.

With reference again to FIG. 3, in some embodiments, the monitoring device 40 can be equipped with an override switch 172. The override switch 172 can be configured to interrupt the delivery of an ignition cutoff signal to the ignition control circuit portion 82 of the monitoring module 42. Thus, if the cart 20 has been remotely disabled, actuation of the override switch 172 can reconnect the ignition circuit and thus reenable the cart 20. Preferably, during a retrofit process when the monitoring device 40 is installed in the cart 20, the monitoring device 40 is placed within the body 22 in a non-obvious position so that only personnel with advanced knowledge of the carts and system will be able to access and actuate the override switch 172. In some embodiments the override switch 172 can be accessible from outside the housing 70. In additional embodiments the override switch 172 can be within the housing 70, requiring a knowledgeable user to remove a lid of the housing in order to actuate the switch. Such a switch 172 can be particularly helpful if a signal transmission problem arises and a previously-sent cut off signal cannot be remotely turned off.

In the illustrated embodiments, wireless communication from the monitoring device 48 is accomplished via a separately-installed GPS unit 50. It is to be understood, however, that, in other embodiments, components such as an antenna and transceiver can be included within the housing 70 of a monitoring device 40. In some embodiments, the GPS unit 50 can be included as a component of the monitoring device 40.

In the illustrated embodiments, the monitoring module 42 has generated certain outputs, but has not performed software-based processing upon such outputs and signals. Instead, these signals have been passed to a remote computer such as the server 54 for further calculations, processing, and presentation in administrator and/or user-directed applications. This has led to certain advantages in connection with presenting an inexpensive and durable product. In other embodiments having different specific goals, processing capacity can be added locally to the cart, whether in a separate processor or as an addition to a monitoring module.

Additionally, the embodiments specifically discussed above have presented inventive aspects in the context of a utility cart. It is to be understood that features described herein can be used with other types of vehicles, and particularly vehicles that traditionally are rented or leased for a limited use within a limited area. For example, some types of watercraft, particularly battery-powered watercraft, can employ aspects described herein. Electric-powered bicycles (i.e., Ebikes) can also employ these inventive aspects. Other, specialized vehicles, such as rental racing carts associated with a racetrack, can employ these inventive principles as well.

The embodiments discussed above have disclosed structures with substantial specificity. This has provided a good context for disclosing and discussing inventive subject matter. However, it is to be understood that other embodiments may employ different specific structural shapes and interactions.

Although inventive subject matter has been disclosed in the context of certain preferred or illustrated embodiments and examples, it will be understood by those skilled in the art that the inventive subject matter extends beyond the specifically disclosed embodiments to other alternative embodiments and/or uses of the invention and obvious modifications and equivalents thereof. In addition, while a number of variations of the disclosed embodiments have been shown and described in detail, other modifications, which are within the scope of the inventive subject matter, will be readily apparent to those of skill in the art based upon this disclosure. It is also contemplated that various combinations or subcombinations of the specific features and aspects of the disclosed embodiments may be made and still fall within the scope of the inventive subject matter. Accordingly, it should be understood that various features and aspects of the disclosed embodiments can be combined with or substituted for one another in order to form varying modes of the disclosed inventive subject matter. Thus, it is intended that the scope of the inventive subject matter herein disclosed should not be limited by the particular disclosed embodiments described above, but should be determined only by a fair reading of the claims that follow.

What is claimed is:

1. A monitoring system for a vehicle having a battery configured to supply energy to a motor, comprising:
   a wireless transceiver;
   a monitoring module operably attached to the wireless transceiver and interposed between the battery and the motor, the monitoring module comprising:
      an energy counting structure configured to track electrical energy flowing into or out of the battery; and
      a battery capacity determining portion configured to determine a maximum energy capacity of the battery, the energy counting structure keeping track of total energy in the battery relative to the maximum energy capacity and configured to output a state of charge signal;
   wherein the state of charge signal is communicated to the wireless transceiver for communication to a remote computer system; and
   wherein the monitoring module is characterized by lack of software.

2. The monitoring system of claim 1, wherein the monitoring module is in communication via the wireless transceiver with a remote computer having a processor, and wherein the processor is configured to perform calculations on the state of charge signal to calculate a percentage of charge of the battery, and the processor is configured to output the percentage of charge to a computer screen.

3. The monitoring system of claim 2, comprising a GPS unit communicating with the wireless transceiver in a manner so that position signals from the GPS unit are transmitted to the remote computer.

4. The monitoring system of claim 3, wherein the processor of the remote computer is configured to determine a first distance travelled over a first time and a change in the state of charge signal over the first time so as to determine a battery health.

5. The monitoring system of claim 3, wherein the remote computer is configured to establish geofences on a position map and to use the position signals from the GPS unit to establish the position of the GPS unit relative to the geofences.

6. The monitoring system of claim 5, wherein the wireless transceiver is configured so as to communicate with the remote computer from a first position within the geofences and a second position outside of the geofences.

7. The monitoring system of claim 1, wherein an ignition circuit of the vehicle passes through the monitoring module, and a relay switch is interposed in the ignition circuit within the monitoring module, and wherein the monitoring module comprises an ignition control circuit portion configured to receive a cutoff signal from a source remote from the monitoring module and to open the relay switch when receiving the cutoff signal.

8. The monitoring system of claim 7, wherein the motor is a gas-powered motor.

9. The monitoring system of claim 7 additionally comprising a manually-operable override switch configured to close the portion of the circuit so as to circumvent the relay switch.

10. The monitoring system of claim 1, wherein the vehicle is a utility cart.

11. The monitoring system of claim 1, wherein the motor is an electric motor.

12. A monitoring system for a vehicle having a battery configured to supply energy to a motor, comprising:
   a wireless transceiver;
   a monitoring module operably attached to the wireless transceiver and interposed between the battery and the motor, the monitoring module comprising:
      an energy counting structure configured to track electrical energy flowing into or out of the battery; and
      a battery capacity determining portion configured to determine a maximum energy capacity of the battery, the energy counting structure keeping track of total energy in the battery relative to the maximum energy capacity and configured to output a state of charge signal;
   wherein the state of charge signal is communicated to the wireless transceiver for communication to a remote computer system; and
   wherein the battery capacity determining portion configures a plurality of manual switches, and the battery capacity determining portion is configured to identify the maximum energy capacity of the battery based on positions of the manual switches.

13. The monitoring system of claim 12, wherein the battery capacity determining portion is configured to identify the maximum energy capacity as one of a plurality of possible discrete capacities based on positions of the manual switches.

14. The monitoring system of claim 13, wherein the automatic recalibration portion comprises a manual switch, the manual switch being configured to set the threshold voltage.

15. The monitoring system of claim 12, wherein the monitoring module is characterized by a lack of a software-operated processor.

16. The monitoring system of claim 15, wherein the monitoring module is in communication via the wireless transceiver with a remote computer having a processor, and wherein the processor is configured to perform calculations on the state of charge signal to calculate a percentage of charge of the battery.

17. A monitoring system for a vehicle having a battery configured to supply energy to a motor, comprising:
   a wireless transceiver;
   a monitoring module operably attached to the wireless transceiver and interposed between the battery and the motor, the monitoring module comprising:
      an energy counting structure configured to track electrical energy flowing into or out of the battery;
      a battery capacity determining portion configured to determine a maximum energy capacity of the battery, the energy counting structure keeping track of total energy in the battery relative to the maximum energy capacity and configured to output a state of charge signal; and
      an automatic recalibration portion, the automatic recalibration portion configured to trigger recalibration of sensed battery capacity to a maximum energy capacity automatically upon sensing a battery voltage at or more than a threshold valve while also sensing that an ignition circuit of the utility cart is in an interrupted condition;

wherein the state of charge signal is communicated to the wireless transceiver for communication to a remote computer system.

18. The monitoring system of claim 17, wherein the monitoring module is characterized by a lack of a software-operated processor.

19. The monitoring system of claim 18, wherein the monitoring module is in communication via the wireless transceiver with a remote computer having a processor, and wherein the processor is configured to perform calculations on the state of charge signal to calculate a percentage of charge of the battery.

* * * * *